US005304942A

United States Patent [19]

Symons et al.

[11] Patent Number: 5,304,942

[45] Date of Patent: Apr. 19, 1994

[54] EXTENDED INTERACTION OUTPUT CIRCUIT FOR A BROAD BAND RELATIVISTIC KLYSTRON

[75] Inventors: Robert S. Symons, Los Altos; Syeda Begum, Sunnyvale, both of Calif.

[73] Assignee: Litton Systems, Inc., Beverly Hills, Calif.

[21] Appl. No.: 881,813

[22] Filed: May 12, 1992

[51] Int. Cl.[5] .......... H03F 3/56

[52] U.S. Cl. .......... 330/45; 315/5.39

[58] Field of Search .......... 315/5, 5.39, 5.51; 330/45; 331/83

[56] References Cited

U.S. PATENT DOCUMENTS 2,970,242 1/1961 Jepsen .......... 315/5.39
4,284,922 8/1981 Perring et al. .
4,931,695 6/1990 Symons .......... 315/5.39

FOREIGN PATENT DOCUMENTS 1004976 9/1965 United Kingdom .
1199341 7/1970 United Kingdom .
2098390A 11/1982 United Kingdom .

*Primary Examiner*—James B. Mullins
*Attorney, Agent, or Firm*—Graham & James

[57] ABSTRACT

An extended interaction output circuit interacts with a modulated electron beam and outputs RF electromagnetic energy. The circuit comprises a plurality of linearly disposed cavities each having a gap permitting the traveling therethrough of the modulated electron beam. A first pair of the linearly disposed cavities is coupled by a single side cavity, a second pair of the linearly disposed cavities is coupled by a pair of side cavities radially disposed 180 degrees apart, and a third pair of the linearly disposed cavities is coupled by three side cavities radially disposed 120 degrees apart. The linearly disposed cavities act as an RF filter having successively tapered impedances to reduce reflections of the electromagnetic energy propagating through the circuit. RF energy is extracted from the fourth cavity through four waveguide sections that are radially disposed 90 degrees apart.

30 Claims, 3 Drawing Sheets

$ZI + \frac{V}{4I}$

EXTENDED INTERACTION OUTPUT CIRCUIT FOR A BROAD BAND RELATIVISTIC KLYSTRON

BACKGROUND OF THE INVENTION

FIELD OF THE INVENTION

The present invention relates to electromagnetic output circuits for extracting RF electric energy from a bunched electron beam, and more particularly, to a novel extended interaction output circuit for a relativistic klystron where the electromagnetic energy is extracted from a linear beam over broad bandwidth.

DESCRIPTION OF RELATED ART

Linear beam tubes are used in sophisticated communication and radar systems which require amplification of an RF or microwave electromagnetic signal. A conventional klystron is an example of a linear beam tube microwave amplifier. A klystron comprises a number of cavities divided into essentially three sections: an input section, a buncher section, and an output section. An electron beam is sent through the klystron, and the buncher section amplifies the modulation on the electron beam and produces a highly bunched beam which contains an RF current. The RF energy is extracted from the beam at the output section.

The bandwidth of a klystron is usually limited by the bandwidth of the output section. To increase the bandwidth, klystron output circuits having more than one cavity interacting with the electron beam were developed. These multi-cavity circuits are known as extended interaction output circuit (EIOC). In an EIOC, energy can be removed from the electrons at reduced voltage at each of several gaps over bandwidth which is greater by an amount which varies inversely as the impedance level. An example of a high performance EIOC is disclosed in U.S. Pat. No. 4,931,695, which in incorporated herein by reference.

Typical klystrons have non-relativistic electron beams, which travel at a velocity much slower than the velocity of light. The electromagnetic wave travels much faster than a non-relativistic electron beam. In order to achieve an efficient energy exchange between the beam and the output circuit, the electromagnetic wave that travels within the output circuit must synchronize with the beam with respect to the velocity of propagation. The '695 patent discloses the use of a multi-cavity EIOC, which further utilizes coupling irises to join adjacent cavities. The dimensions and the locations of the gaps and the irises can be selected to induce a phase shift of the electromagnetic wave which matches that of the modulated electron beam. The phase shift reduces the effective velocity of propagation of the wave relative to the beam, enabling synchronization between the wave and the beam.

A significant problem with the prior art multi-cavity EIOCs is that they become less efficient as the klystron power is increased. Broad band, relativistic klystrons under development are expected to produce 600 kv and operate at a peak power higher in relation to the pulse length and frequency than that of any existing klystron. These high powered klystrons have relativistic beams (as determined by the beam voltage) which travel much closer to the velocity of light. Consequently, the approach of the '695 patent would be inefficient with relativistic broadband klystrons in which the beam velocity approaches that of the wave, since the phase shift introduced would result in the wave falling out of synchronization with the beam.

Relativistic beam synchronization has been successfully achieved in-linear accelerators. An output circuit having this characteristic was described in E. A. Knapp, B. C. Knapp and J. M. Potter, *Standing Wave High Energy Linear Accelerator Structures*, 39 Review of Scientific Instruments 979 (July 1968). The Knapp circuit utilizes side cavities to couple the linear cavities along the length of the tube. The side cavities induce less phase shift than the coupling irises described in the '695 patent above. Unfortunately, the Knapp circuit achieved relatively low bandwidth, but since a linear accelerator's bandwidth is not a critical parameter, this was not considered a drawback. Nevertheless, this technique was not considered practical to the art of klystron output circuit design, in which broad bandwidth is an important characteristic.

Accordingly, it would be desirable to provide an output circuit for use with a relativistic klystron having the efficient beam synchronization characteristics of a Knapp circuit, while providing the broad bandwidth and reduced RF loss characteristics of a multi-cavity extended interaction output circuit. It would be further desirable to provide an output circuit design having the above characteristics, while being relatively simple to design and construct.

SUMMARY OF THE INVENTION

Accordingly, a principal object of the present invention is to provide an output circuit for use with a relativistic klystron having both the efficient beam synchronization characteristics of Knapp circuits and the broad bandwidth and reduced RF loss characteristics of multi-cavity extended interaction output circuits.

In accomplishing this objective, there is provided an extended interaction output circuit for interacting with a modulated electron beam and for outputting RF electromagnetic energy. The circuit comprises a plurality of linearly disposed cavities each having a gap permitting the traveling therethrough of the modulated electron beam. A first pair of the linearly disposed cavities is coupled by a single side cavity, a second pair of the linearly disposed cavities is coupled by a pair of side cavities, and a third pair of the linearly disposed cavities is coupled by three side cavities. The linearly disposed cavities act as an RF filter having successively tapered impedances to reduce reflections of the electromagnetic energy propagating through the circuit.

More specifically, the extended interaction output circuit comprises a first linear cavity, a second linear cavity, a third linear cavity, and a fourth linear cavity. A single side cavity couples the first linear cavity and the second linear cavity, the electromagnetic energy travelling between the first linear cavity and the second linear cavity via the single side cavity. A pair of side cavities radially disposed 180 degrees apart couples the second linear cavity and the third linear cavity, the electromagnetic energy travelling between the second linear cavity and the third linear cavity via the pair of side cavities. Three side cavities radially disposed 120 degrees apart couple the third linear cavity and the fourth linear cavity, the electromagnetic energy travelling between the third linear cavity and the fourth linear cavity via the three side cavities. RF energy is extracted from the fourth cavity through four waveguide sections that are radially disposed 90 degrees apart.

The first, second, third and fourth linear cavities act as an RF filter network having first, second and third image impedances and a load impedance. The second image impedance is approximately one half of the first image impedance, the third image impedance is approximately one third of the first image impedance, and the load is approximately one fourth of the first image impedance.

A more complete understanding of the novel extended interaction output circuit for a broad band relativistic klystron of the present invention will be afforded to those skilled in the art, as well as a realization of additional advantages and objects thereof, by consideration of the following detailed description of the preferred embodiment. Reference will be made to the appended sheets of drawings which will be first described briefly.

Figure 1:
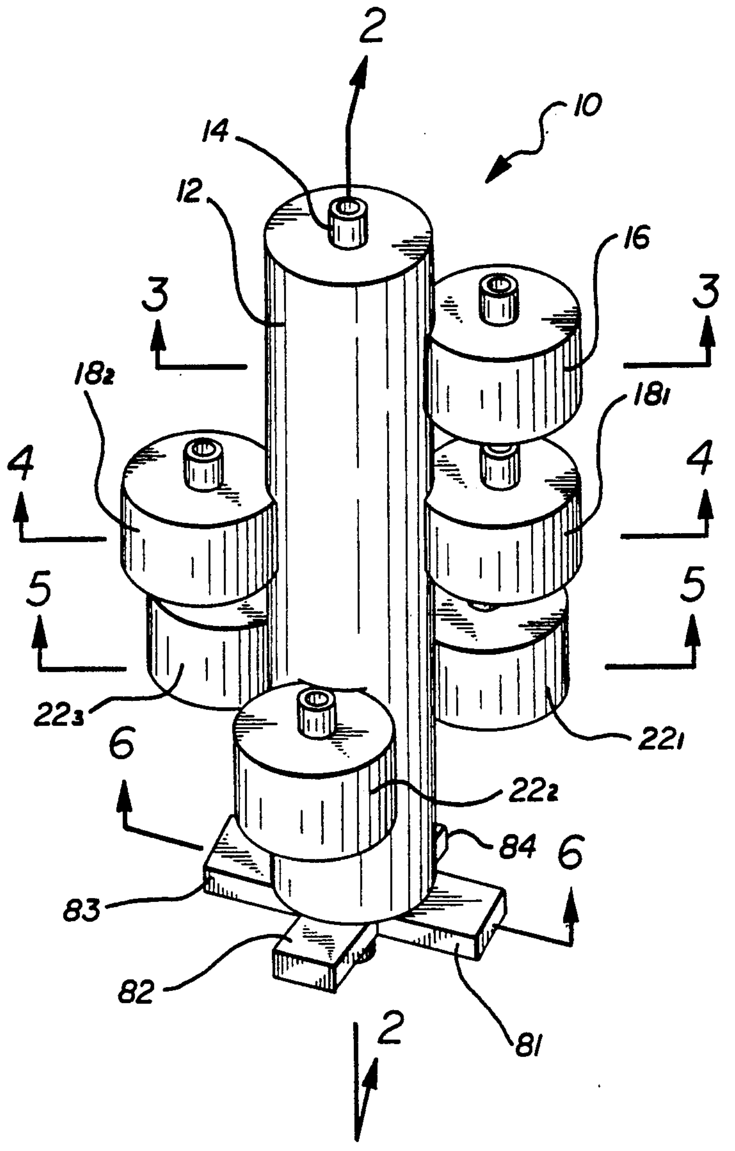
FIG. 1 is a perspective view of an extended interaction output circuit of the present invention.
Figure 6:
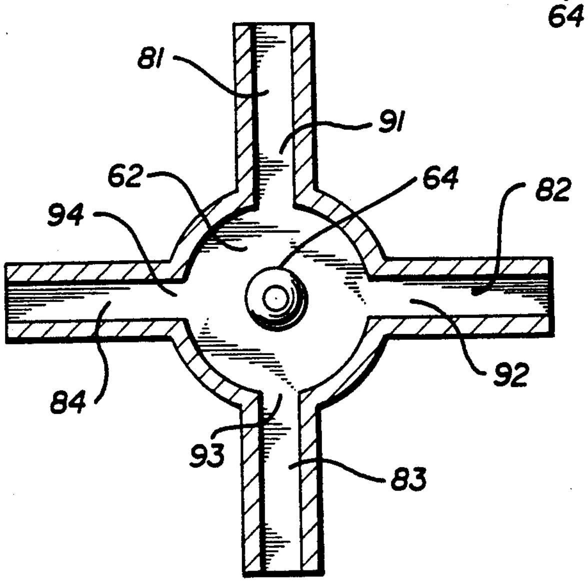
Figure 3:
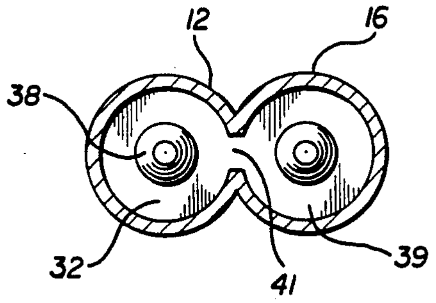
Figure 4:
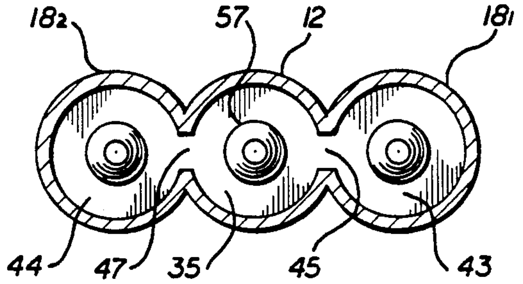
Figure 5:
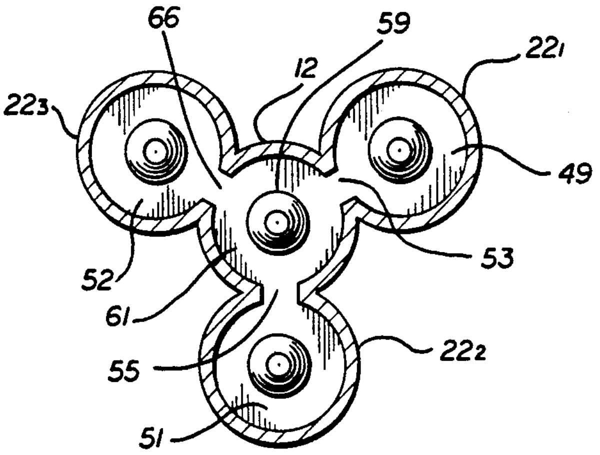
Figure 7:
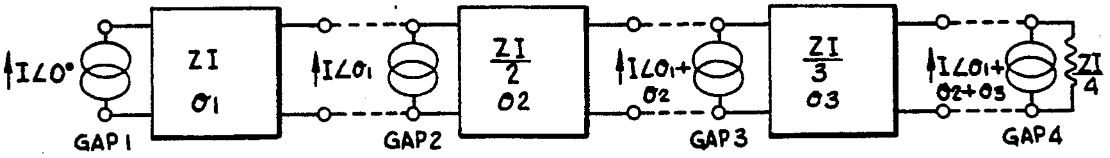

FIG. *2a* is a cross-sectional side view of the upper portion of the extended interaction output circuit, as taken through the section 2—2 of FIG. 1;

FIG. *2b* is a cross-sectional side view of the middle portion of the extended interaction output circuit, as taken through the section 2—2 of FIG. 1;

FIG. *2c* is a cross-sectional side view of the lower portion of the extended interaction output circuit, as taken through the section 2—2 of FIG. 1;

FIG. 3 is a cross-sectional top view of the extended interaction output circuit showing a first side cavity, as taken through the section 3—3 of FIG. 1;

FIG. 4 is a cross-sectional top view of the extended interaction output circuit showing a pair of side cavities, as taken through the section 4—4 of FIG. 1;

FIG. 5 is a cross-sectional top view of the extended interaction output circuit showing three side cavities, as taken through section 5—5 of FIG. 1;

FIG. 6 is a cross-sectional top view of the extended interaction output circuit showing RF output waveguides, as taken through section 6—6 of FIG. 1; and FIG. 7 is an electrical equivalent circuit of the extended interaction output circuit of FIG. 1.

DETAILED DESCRIPTION OF THE PREFERRED EMBODIMENT

In FIG. 1 there is shown a perspective view of an extended interaction output circuit, generally denoted by reference numeral 10, embodying the concepts of the present invention. The circuit 10 has an elongated center section 12 having a beam tunnel 14 which extends axially through the center section 12. A plurality of side tube sections are joined to the center section 12, including a first side section 16 joined to an upper portion of the center section 12, a pair of side sections $18_1$ and $18_2$ joined to a middle portion of the center section 12, and three side sections $22_1$, $22_2$, and $22_3$ joined to a lower portion of the center section 12. Extending outwardly from an end of the center section 12 are four waveguide sections 81, 82, 83 and 84. As will be further described below, a modulated electron beam is projected through the beam tunnel 14 of the center section 12 causing amplified RF energy to be produced at the waveguide sections.

The center section 12 has four in-line cavities 32, 35, 61, and 62. A first side cavity 39 is provided in the side tube section 16. A second set of side cavities, comprising cavities 43 and 44 are provided in the second side tube sections $18_1$ and $18_2$, respectively. The two side tube sections $18_1$ and $18_2$ are disposed 180 degrees apart relative to the center tube section 12. A third set of side cavities, comprising cavities 49, 51, and 52, are provided in the side sections $22_1$, $22_2$, and $22_3$ respectively. The third side sections $22_1$, $22_2$, and $22_3$ are disposed at 120 degrees apart relative to the center tube section 12. The first side cavity 39 couples the first in-line cavity 32 with the second in-line cavity 35 via ports 41 and 42. The second set of side cavities 43 and 44 couple the second in-line cavity 35 with the third in-line cavity 61 via ports 45, 46, 47 and 48. The third set of side cavities 49, 51 and 52 couple the third in-line cavity 61 with the fourth in-line cavity 62 via ports 53, 54, 55, 56, 66 and 67. The waveguide sections 81, 82, 83 and 84 couple to the fourth in-line cavity 62 via ports 91, 92, 93 and 94, respectively.

Figure 2A:
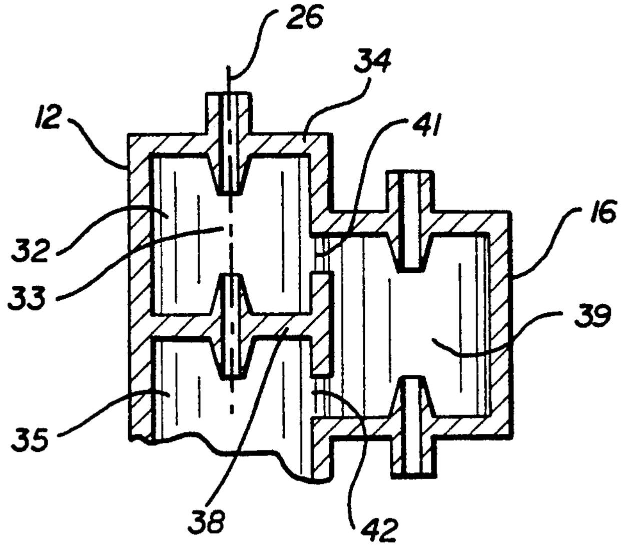

Referring now to FIGS. 2A and 3, there is shown the upper portion of the extended interaction output circuit 10. Coupling ports 41 and 42 provide an RF path between the in-line cavities 32 and 35 and the side cavity 39. The electron beam 26 passes through a first drift tube section 34 and a gap 33 within cavity 32, into the second drift tube section 38. The bunched electron beam 26 excites the first cavity 32 and creates an electromagnetic field which produces an RF magnetic wave which propagates through the coupling port 41 into the first side cavity 39. The RF wave then propagates from the first side cavity 209 to the second in-line cavity 35 via the coupling port 42. The modulated electron beam then passes through the second drift tube section 38 and across the second gap 36 of the second cavity 35, further reinforcing the RF electromagnetic wave.

Figure 2B:
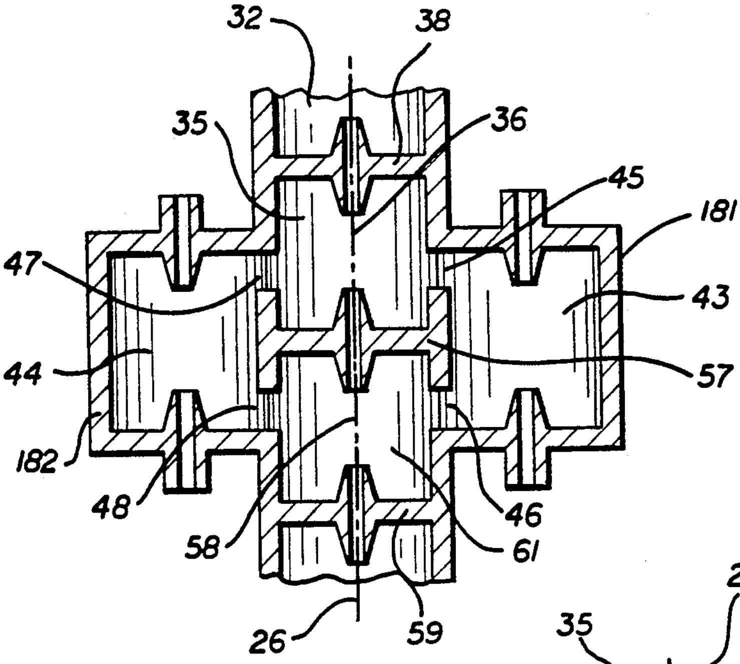

The middle portion of the extended interaction output circuit is shown in FIGS. 2B and 4. The middle portion is rotated relative the upper portion, so that the side tube portions 16 and 18 do not overlap each other. The RF electromagnetic wave propagates from the second in-line cavity 35 into the side cavity 43 through coupling port 45, and into side cavity 44 via coupling port 47. The electromagnetic RF wave then propagates to the third in-line cavity 61 from the side cavities 43 and 44 through the coupling ports 48 and 46. The electron beam passes through the third drift tube section 57 and across the gap 58 in the third in-line cavity 61, further reinforcing the RF electromagnetic wave.

Figure 2C:
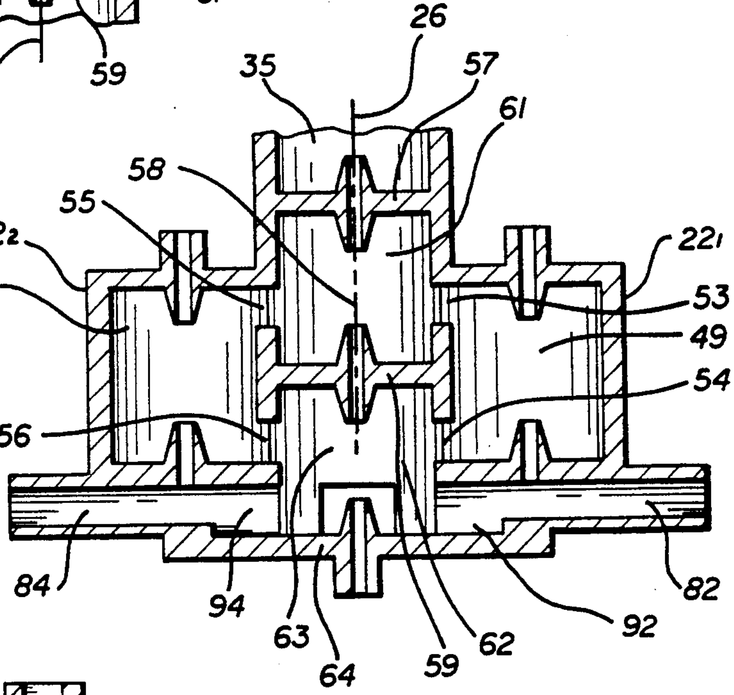

The lower portion of the extended interaction output circuit 10 is shown in FIGS. 2C and 5. As with the middle portion, the lower portion is rotated so that the side tube portions 18 and 22 do not overlap each other. As the beam 26 crossed the gap 58 of the third in-line cavity 61, the RF electromagnetic wave is further reinforced. The RF wave then propagates into the side cavities 49, 51, and 52 through the coupling ports 53, 55 and 66, respectively. The wave then propagates from the side cavities 49, 51 and 52 through the coupling ports 54, 56 and 67, respectively, into the fourth in-line cavity 62. As the electron beam passes through the fourth drift tube section 59 and across the gap 63 of the fourth in-line cavity 62, the RF wave is further reinforced.

FIG. 6 shows the coupling between the output waveguide sections 81, 82, 83 and 84, and the fourth in-line cavity 62. The waveguide sections serve as an output transmission for the amplified RF energy. Coupling ports 91, 92, 93 and 94 couple the fourth in-line cavity 62 to the output waveguide. The waveguide sections are symmetrically disposed radially at 90 degree intervals. Spent electrons of the beam exit through the drift tube section 64 to a collector (not shown).

The gap-to-gap distance in the successive in-line cavities is chosen such that the phase shift of the RF wave that travels from one in-line cavity to the next in-line cavity via a side cavity or cavities is the same as the change in phase of the electron beam current traveling between the two cavities. For ease of design, the dimensions of each of the in-line and side cavities are identical.

In FIG. 7 there is shown an equivalent electrical circuit of the extended interaction output circuit of FIG. 1. The circuit comprises a first current generator 71, a first filter circuit 72, a second current generator 73, a second filter circuit 74, a third current generator 75, a third filter circuit 76, a fourth current generator 77, and a first resistance 78.

The current generators represent the modulated electron beam at each of the gaps of the in-line cavities. Specifically, the first current generator 71 represents the modulated electron beam 26 at the first gap 33 of the first in-line cavity 32, the second current generator 73 represents the modulated electron beam 26 at the second gap 36 of the second in-line cavity 35, the third current generator 75 represents the modulated electron beam 26 at the third gap 58 of the third in-line cavity 61, and the fourth current generator 77 represents the modulated electron beam 26 at the fourth gap 63 of the fourth in-line cavity 62.

The phase of the modulated beam 26 shifts as it passes each of the gaps. The phase of the current generated by the current generator 71 is therefore taken as a reference angle at 0 degrees. The phase of the current generated by the current generator 73 is $\Theta_1$. The phase of the current generator 75 is $\Theta_1+\Theta_2$. The phase of the current generator 77 is $\Theta_1+\Theta_2+\Theta_3$.

The image impedance of the successive filters tapers in order to reduce reflections of the forward traveling wave propagating through the circuit. The first filter circuit 72 has an image impedance $Z_I$ and an image transfer constant of $\Theta_1$, which is the same as the difference in phase between the current generators 71 and 73. The second filter circuit 74 has an image impedance $Z_I/2$, and an image transfer constant of $\Theta_2$, which is the same as the difference in phase between the current generators 73 and 75. The third filter circuit 76 has an image impedance $Z_I/3$ and an image transfer constant of $\Theta_3$, which is the same as the difference in phase between the current generators 75 and 77. The resistance 78 has a resistance equal to $Z_I/4$. Image impedance $Z_I$ represents the sum of the capacitance of the first in-line cavity 32 across the gap 33, the inductance of the first in-line cavity 32, the impedance of the coupling port 41 between the first in-line cavity 32 and the first side cavity 39, the impedance of the coupling port 42 between the first side cavity 39 and the second in-line cavity 35, the impedance of the first side cavity 39, and a portion of the inductance of the second in-line cavity 35. Image impedance $Z_I/2$ represents the capacitance of the second in-line cavity 35 across the gap 36, the remaining portion of the inductance of the second in-line cavity 35, the impedances of the coupling ports 45 and 47 between the second in-line cavity 35 and the second set of side cavities 43 and 44, respectively, the impedances of the coupling ports 46 and 48 between the second set of side cavities 43 and 44, respectively, and the third in-line cavity 61, the impedances of the second set of side cavities 43 and 44, and a portion of the inductance of the third in-line cavity 61. Image impedance $Z_I/3$ represents the capacitance of the third in-line cavity 61 across the gap 58, the remaining portion of the inductance of the third in-line cavity 61, the impedances of the coupling ports 53, 54 and 55 between the third in-line cavity 61 and the third set of side cavities 49, 51 and 52, respectively, the impedances of the coupling ports 56, 66 and 67 between the third set of side cavities 49, 51 and 52, respectively, and the fourth in-line cavity 62, and the impedances of the third set of side cavities 49, 51 and 52. The resistance $Z_I/4$ represents the resistive load to the waveguide 24.

Having thus described a preferred embodiment of a novel extended interaction output circuit for a broadband relativistic klystron, it should now be apparent to those skilled in the art that the aforestated objects and advantages for the within system have been achieved. It should also be appreciated by those skilled in the art that various modifications, adaptations, and alternative embodiments thereof may be made within the scope and spirit of the present invention, which is further defined by the following claims.

What is claimed is:

1. An extended interaction output circuit for interacting with a modulated electron beam and for outputting RF electromagnetic energy, said circuit comprising:

a first linear cavity having a gap permitting passage of said modulated electron beam therethrough;

a second linear cavity having a second gap permitting passage of said modulated electron beam therethrough and a first means for coupling said first linear cavity and said second linear cavity, said electromagnetic energy travelling between said first linear cavity and said second linear cavity via said first coupling means;

a third linear cavity having a third gap permitting passage of said modulated electron beam therethrough and a second means for coupling said second linear cavity and said third linear cavity, said electromagnetic energy travelling between said second linear cavity and said third linear cavity via said second coupling means;

a fourth linear cavity having a fourth gap permitting passage of said modulated electron beam therethrough and a third means for coupling said third linear cavity and said fourth linear cavity, said electromagnetic energy travelling between said third linear cavity and said fourth linear cavity via said third coupling means;

said first, second and third coupling means each comprising at least one side cavity; and said first, second, third and fourth linear cavities acting as an RF filter network having first, second and third image impedances and a load impedance, said second image impedance being approximately one half of said first image impedance, said third image impedance being approximately one third of said first image impedance, and said load impedance being approximately one fourth of said first image impedance.

2. An extended interaction output circuit for interacting with a modulated electron beam and for outputting RF electromagnetic energy, said circuit comprising:

a first linear cavity having a gap permitting passage of said modulated electron beam therethrough;

a second linear cavity having a second gap permitting passage of said modulated electron beam therethrough and a first means for coupling said first linear cavity and said second linear cavity, said electromagnetic energy traveling between said first linear cavity and said second linear cavity via said first coupling means, said first coupling means comprises a single side cavity;

a third linear cavity having a third gap permitting passage of said modulated electron beam therethrough and a second means for coupling said second linear cavity and said third linear cavity, said electromagnetic energy traveling between said second linear cavity and said third linear cavity via said second coupling means;

a fourth linear cavity having a fourth gap permitting passage of said modulated electron beam therethrough and a third means for coupling said third linear cavity and said fourth linear cavity, said electromagnetic energy traveling between said third linear cavity and said fourth linear cavity via said third coupling means; and said first, second, third and fourth linear cavities acting as an RF filter network having first, second and third image impedances and a load impedance, said second image impedance being approximately one half of said fist image impedance, said third image impedance being approximately one third of said first image impedance, and said load impedance being approximately one fourth of said first image impedance.

3. The extended interaction output circuit of claim 2, wherein said second coupling means comprises a pair of side cavities disposed approximately 180 degrees apart.

4. The extended interaction output circuit of claim 3, wherein said third coupling means comprises three side cavities disposed approximately 120 degrees apart.

5. The extended interaction output circuit of claim 4, further comprising an output section having four radially disposes waveguides, said RF electromagnetic energy being extracted from said fourth linear cavity through said waveguides.

6. The extended interaction output circuit of claim 5, wherein said first linear cavity, said second linear cavity, said third linear cavity, said fourth linear cavity and each of said side cavities each have substantially equivalent resonant frequencies.

7. An extended interaction output circuit for interacting with a modulated electron beam and for outputting RF electromagnetic energy, said circuit comprising:

a plurality of linearly disposed cavities, each of said cavities having a gap for permitting the traveling therethrough of said modulated electron beam, a first pair of said linearly disposed cavities being coupled by at least one side cavity, a second pair of said linearly disposed cavities being coupled by a first set of said side cavities, and a third pair of said linearly disposed cavities being coupled by a second set of said side cavities;

wherein, said linearly disposed cavities act as an RF filter having successively tapered impedances to reduce reflections of said electromagnetic energy propagating through said circuit.

8. The extended interaction output circuit of claim 7, wherein said at least one side cavity comprises a single side cavity.

9. The extended interaction output circuit of claim 8, wherein said first set of side cavities comprises a pair of side cavities disposed approximately 180 degrees apart.

10. The extended interaction output circuit of claim 9, wherein said second set of side cavities comprises three side cavities disposed approximately 120 degrees apart.

11. The extended interaction output circuit of claim 7, wherein said RF filter has first, second and third image impedances and a load impedance, said second image impedance being approximately one half of said first image impedance, said third image impedance being approximately one third of said first image impedance, and said load impedance being approximately one fourth of said first image impedance.

12. The extended interaction output circuit of claim 11, further comprising an output section having four radially disposes waveguides, said RF electromagnetic energy being extracted from a final one of said linearly disposed cavities through said waveguides.

13. An RF amplification circuit for interacting with an electron beam and for outputting RF electromagnetic energy, said circuit comprising:

a plurality of linearly disposed cavities, each of said cavities having a gap for permitting the traveling therethrough of said electron beam, a first pair of said linearly disposed cavities being coupled by at least one side cavity, a second pair of said linearly disposed cavities being coupled by a first set of said side cavities, and a third pair of said linearly disposed cavities being coupled by a second set of said side cavities.

14. The RF amplification circuit of claim 13, wherein said linearly disposed cavities provide an RF filter having successively tapered impedances to reduce reflections of said RF electromagnetic energy propagating through said circuit.

15. The RF amplification circuit of claim 14, wherein said at least one side cavity comprises a single side cavity.

16. The RF amplification circuit of claim 15, wherein said first set of side cavities comprises a pair of side cavities disposed approximately 180 degrees apart.

17. The RF amplification circuit of claim 16, wherein said second set of side cavities comprises three side cavities disposed approximately 120 degrees apart.

18. The RF amplification circuit of claim 17, wherein said RF filter has first, second and third image impedances and a load impedance, said second image impedance being approximately one half of said first image impedance, said third image impedance being approximately one third of said first image impedance, and said load impedance being approximately one fourth of said first image impedance.

19. The RF amplification circuit of claim 18, further comprising an output section having four radially disposes waveguides, said RF electromagnetic energy being extracted from a final one of said linearly disposed cavities through said waveguides.

20. The RF amplification circuit of claim 19, wherein said circuit is an extended interaction output circuit.

21. An extended interaction output circuit for interacting with a modulated electron beam and outputting RF electromagnetic energy, said circuit comprising:

a first, second, third and fourth linearly disposed cavity, each adjacent pair of said linearly disposed cavities being coupled by at least one side cavity, said linearly disposed cavities providing an RF filter having successively tapered impedances through reduced reflections of said electromagnetic energy propagating through said circuit.

22. The circuit of claim 21, wherein said RF filter has first, second and third image impedances and a load impedance, said second image impedance being approximately one half of said first image impedance, said third image impedance being approximately one third of said first image impedance, and said load impedance being approximately one fourth of said image impedance.

23. The circuit of claim 21, wherein each of said adjacent pairs of said linearly disposed cavities are coupled by a greater number of said side cavities than a previously linearly disposed adjacent pair.

24. The circuit of claim 21, wherein a first pair of said linearly disposed cavities are coupled by a single one of said side cavities.

25. The circuit of claim 24, wherein a second pair of said linearly disposed cavities are coupled by two of said side cavities.

26. The circuit of claim 25, wherein a third pair of said linearly disposed cavities are coupled by three of said side cavities.

27. The circuit of claim 26, wherein said three side cavities are disposed approximately 120 degrees apart.

28. The circuit of claim 25, wherein said two side cavities are disposed approximately 180 degrees apart.

29. An extended interaction output circuit for interacting with a modulated electron beam and for outputting RF electromagnetic energy, said circuit comprising:

a plurality of linearly disposed cavities, each adjacent pair of said linearly disposed cavities being coupled by at least one side cavity;

wherein, said linearly disposed cavities act as an RF filter having successively tapered impedances to reduce reflections of said electromagnetic energy propagating through said circuit.

30. The circuit of claim 29, wherein each of said adjacent pairs of said linearly disposed cavities are coupled by a greater number of said side cavities than a previously linearly disposed adjacent pair.

* * * * *

UNITED STATES PATENT AND TRADEMARK OFFICE

CERTIFICATE OF CORRECTION

PATENT NO. : 5,304,942

DATED : April 19, 1994

INVENTOR(S) : SYMONS ET AL.

It is certified that error appears in the above-indentified patent and that said Letters Patent is hereby corrected as shown below:

At column 1, line 5, please insert the following text before the "BACKGROUND OF THE INVENTION":

--This invention was conceived under Contract No. DAAH-01-90-C-A013 awarded by the United States Government, that is entitled to certain rights in this invention.--

Signed and Sealed this

Twenty-seventh Day of December, 1994

*Attest:*

BRUCE LEHMAN

*Attesting Officer* *Commissioner of Patents and Trademarks*